(12) United States Patent
Lee

(10) Patent No.: US 8,675,416 B2
(45) Date of Patent: Mar. 18, 2014

(54) FLASH MEMORY DEVICE AND RELATED PROGRAM VERIFICATION METHOD

(75) Inventor: Ji-Sang Lee, Iksan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 343 days.

(21) Appl. No.: 13/235,533

(22) Filed: Sep. 19, 2011

(65) Prior Publication Data

US 2012/0069674 A1    Mar. 22, 2012

(30) Foreign Application Priority Data

Sep. 20, 2010 (KR) .................. 10-2010-0092489

(51) Int. Cl.
*G11C 16/06* (2006.01)

(52) U.S. Cl.
USPC .................. 365/185.22; 365/185.19

(58) Field of Classification Search
USPC ............. 365/185.18, 185.19, 185.22, 189.16, 365/189.07
See application file for complete search history.

(56) References Cited

U.S. PATENT DOCUMENTS

| | | | |
|---|---|---|---|
| 7,518,928 B2 | 4/2009 | Guterman et al. | |
| 2007/0086251 A1* | 4/2007 | Lutze et al. | 365/195 |
| 2007/0097747 A1* | 5/2007 | Li et al. | 365/185.17 |
| 2010/0034019 A1* | 2/2010 | Kang et al. | 365/185.03 |
| 2011/0292724 A1* | 12/2011 | Kim | 365/185.03 |

FOREIGN PATENT DOCUMENTS

| | | |
|---|---|---|
| JP | 2007-520845 | 7/2007 |
| KR | 1020060133589 A | 12/2006 |
| KR | 1020100018318 A | 2/2010 |
| KR | 1020100040422 A | 4/2010 |

\* cited by examiner

*Primary Examiner* — Douglas King
(74) *Attorney, Agent, or Firm* — Valentine & Whitt, PLLC

(57) ABSTRACT

A nonvolatile memory device performs a program operation using an incremental pulse programming (ISPP) scheme in which a plurality of program loops alternate between a coarse-fine verify operation, and a fine verify operation according to a value of a program loop counter.

18 Claims, 12 Drawing Sheets

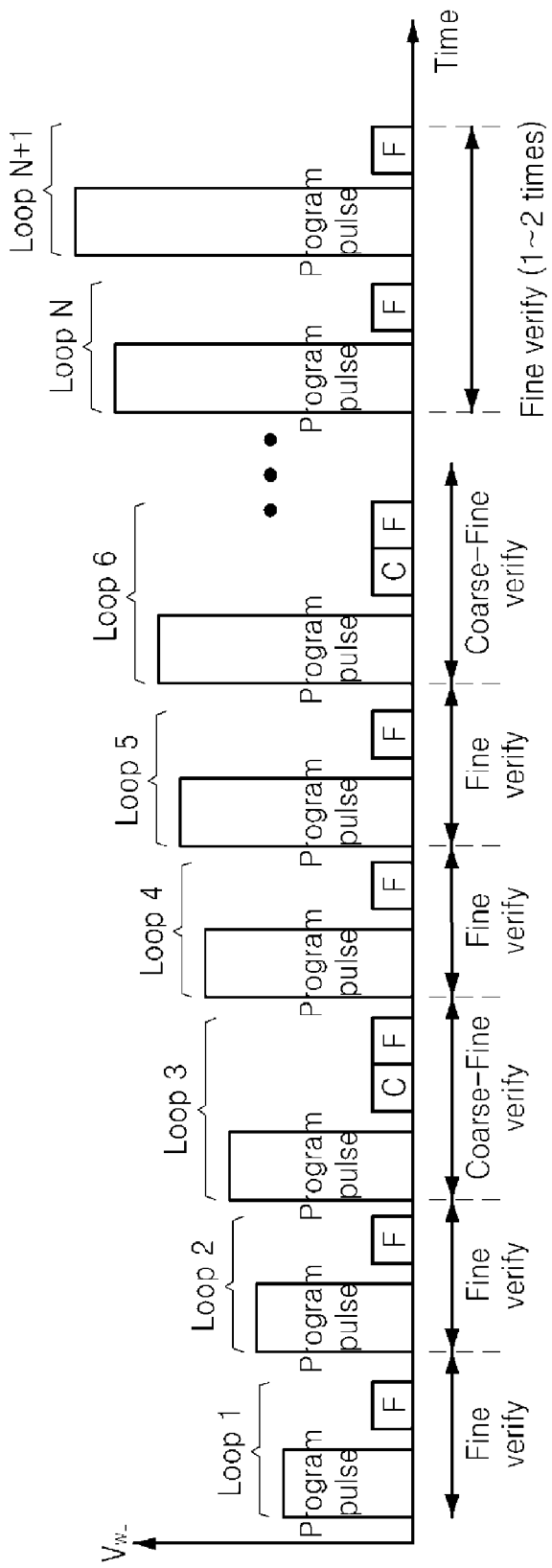

FIG. 8

| 1st Loop Program (Fine Sensing) | | 2nd Loop Program (Coarse-Fine Sensing) | | 3rd Loop Program (Fine Sensing) | | 4th Loop Program (Coarse-Fine Sensing) | |
|---|---|---|---|---|---|---|---|
| CELL POSITION AFTER VERIFY | NEXT LOOP CONDITION | CELL POSITION AFTER VERIFY | NEXT LOOP CONDITION | CELL POSITION AFTER VERIFY | NEXT LOOP CONDITION | CELL POSITION AFTER VERIFY | NEXT LOOP CONDITION |
| A | Program | A,B | Program | A | Program | A,B | Program |
| A | Program | A,B | Program | A | Program | C | Inhibit |
| A | Program | A,B | Program | B,C | Inhibit | B | BL Forcing |
| A | Program | A,B | Program | B,C | Inhibit | C | Inhibit |
| A | Program | C | Inhibit | C | Inhibit | C | Inhibit |
| B,C | Inhibit | B | BL Forcing | C | Inhibit | C | Inhibit |
| B,C | Inhibit | C | Inhibit | C | Inhibit | C | Inhibit |

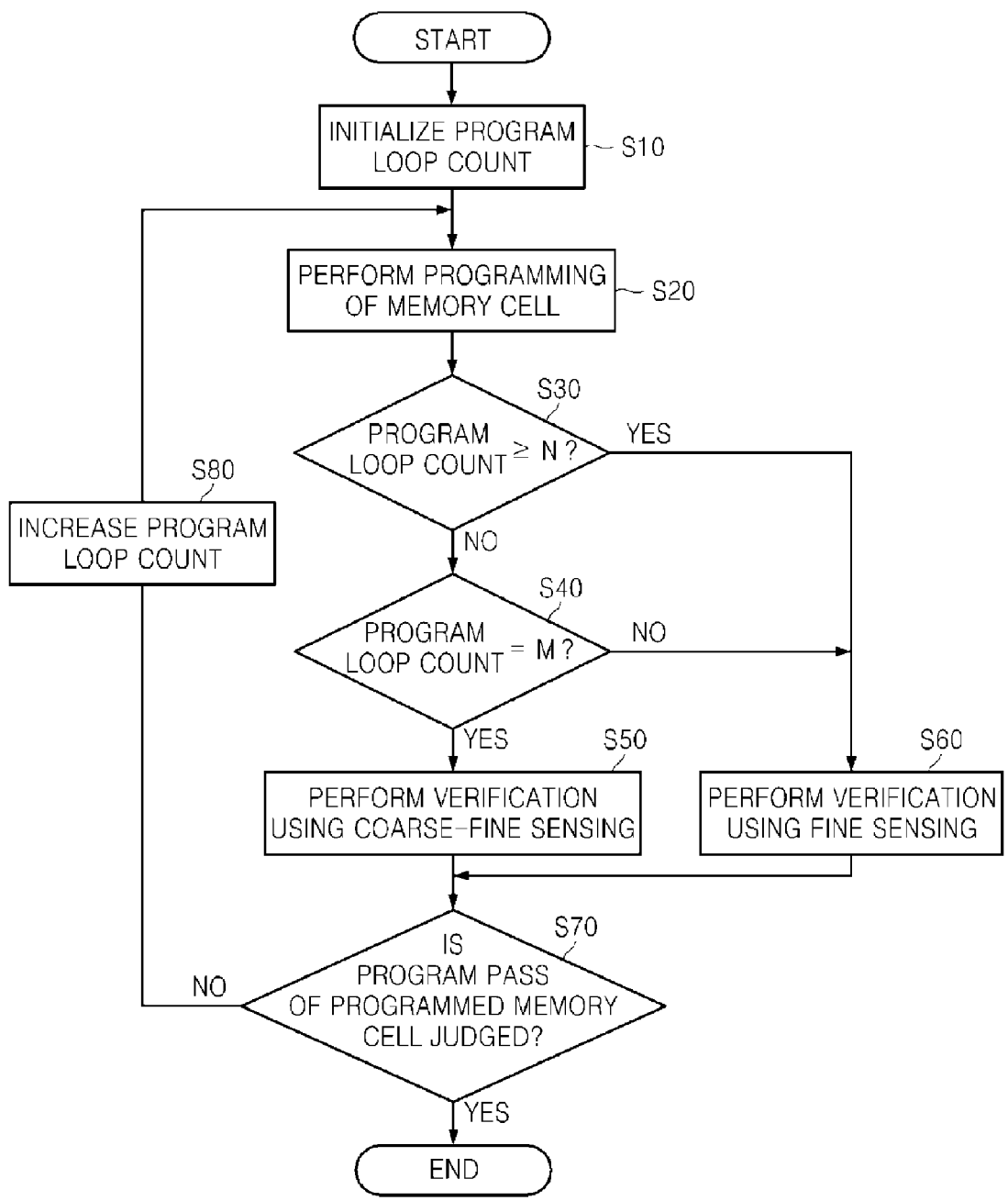

FLASH MEMORY DEVICE AND RELATED PROGRAM VERIFICATION METHOD

CROSS-REFERENCE TO RELATED APPLICATIONS

This application claims priority under 35 U.S.C. §119 to Korean Patent Application No. 10-2010-0092489 filed on Sep. 20, 2010, the disclosure of which is hereby incorporated by reference in its entirety.

BACKGROUND OF THE INVENTION

Embodiments of the inventive concept relate generally to semiconductor memory devices. More particularly, embodiments of the inventive concept relate to flash memory devices and related program verification methods.

Flash memory devices have achieved immense popularity in recent years due to attractive features such as high storage capacity, low power consumption, and the ability to withstand physical shock. Nevertheless, users continue to demand flash memory devices with greater storage capacity and higher performance.

In an effort to improve both storage capacity and performance, researchers have developed flash memory devices with smaller features and tighter operating margins. In doing so, however, they have pushed the limits of device reliability, requiring new operating techniques to compensate for potential failures. One such technique is a programming scheme referred to as incremental step pulse programming (ISPP).

In ISPP, memory cells are programmed in a series of program loops each comprising a program section and a verification section. In the program section, a program pulse voltage is applied to selected memory cells, and in the verification section, the selected memory cells are verified to determine whether they have been successfully programmed to their target states. In successive program loops, the program pulse voltage is increased incrementally to gradually increase the threshold voltages of the selected memory cells.

Although ISPP tends to improve the reliability of programming operations, it is still prone to errors. For example, the verification section may erroneously report that a selected memory cell has been successfully programmed. As a result, the selected memory cell may contain bad data. In an effort to avoid these problems, researchers continue to seek ways to improve the reliability of verification performed in ISPP.

SUMMARY OF THE INVENTION

According to an embodiment of the inventive concept, a method of performing a program verification operation of a flash memory device employing an ISPP scheme is provided. The method comprises (a) setting a program loop count, (b) programming a selected memory cell according to the program loop count, (c) determining whether the program loop count satisfies a predetermined verification condition, (d) consecutively performing first verification and second verification on the selected memory cell if the program loop count satisfies the predetermined verification condition, (e) performing the second verification on the selected memory cell and skipping the first verification if the program loop count does not satisfy the predetermined verification condition, (f) determining a program pass or fail status of the selected memory cell, and (g) increasing the program loop count according to the program pass or fail status and repeating operations (b) through (e). Step (d) is performed at least one time after (e).

According to another embodiment of the inventive concept, a flash memory device performs a program operation using an ISPP scheme and comprises a program loop counter configured to set a program loop count, a program control circuit configured to program a selected memory cell according to the program loop count, a comparator configured to determine whether the program loop count satisfies a predetermined verification condition, a program verify circuit configured to consecutively perform first verification and second verification on the selected memory cell if the program loop count satisfies the predetermined verification condition and to perform only the second verification on the selected memory cell and skip the first verification if the program loop count does not satisfy the predetermined verification condition, and a pass/fail verify circuit configured to determine a program pass or fail status of the selected memory cell. The program loop counter increases the program loop count according to the program pass or fail status, and the first verification and the second verification are consecutively performed at least one time after the second verification is performed and the first verification is skipped.

According to another embodiment of the inventive concept, an electronic system comprises a host device connected to a memory controller and a nonvolatile memory device, wherein the memory controller controls the nonvolatile memory device to perform a program operation in response to a request from the host, and the nonvolatile memory device performs the program operation using an ISPP scheme in which a plurality of program loops alternate between a coarse-fine verify operation, and a fine verify operation according to a value of a program loop counter.

These and other embodiments of the inventive concept can improve the reliability of nonvolatile memory devices by reducing common source line noise.

BRIEF DESCRIPTION OF THE DRAWINGS

The drawings illustrate selected embodiments of the inventive concept. In the drawings, like reference numbers indicate like features.

FIG. 7 is a voltage diagram illustrating a program verification method for a flash memory device according to an embodiment of the inventive concept.

FIG. 8 is a table illustrating changing states of selected memory cells in the program verification method of FIG. 6.

FIG. 9 is a flowchart illustrating the program verification method of FIG. 6 or 7 according to an embodiment of the inventive concept.

DETAILED DESCRIPTION

Selected embodiments of the inventive concept are described below with reference to the corresponding drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. As used herein, the term "and/or" includes any and all combinations of one or more of the associated listed items and may be abbreviated as "/".

Although the terms first, second, etc., may be used herein to describe various elements, these elements should not be limited by these terms. Rather, these terms are used merely to distinguish one element from another. For example, a first signal could be termed a second signal, and similarly, a second signal could be termed a first signal without departing from the present teachings.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. The terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. Terms such as those defined in commonly used dictionaries should be interpreted as having a meaning that is consistent with their meaning in the context of the relevant art and/or the present application, and will not be interpreted in an idealized or overly formal sense unless expressly so defined herein.

Figure 1:
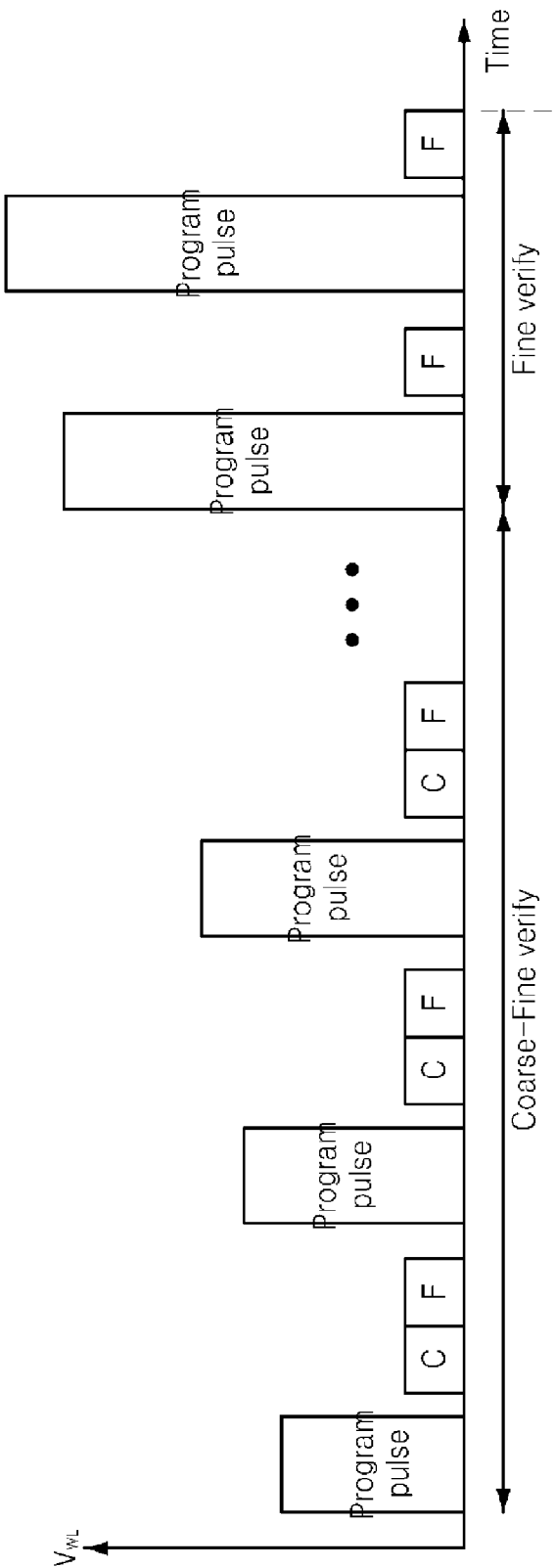
FIG. 1 is a voltage diagram of an ISPP operation using two different types of verification operations according to an embodiment of the inventive concept.

FIG. 1 is a voltage diagram of an ISPP operation using two different types of verification operations according to an embodiment of the inventive concept.

Referring to FIG. 1, the ISPP operation comprises a plurality of loops each comprising a program operation and a program verify operation. The program verify operation is performed to verify a program state of selected memory cells. More specifically, it is performed to determine whether selected memory cells have been successfully programmed by the program operation.

The flash memory device uses the ISPP operation to narrow the width of a threshold voltage distribution of the selected memory cells. When the selected memory cells are programmed using the ISPP operation, a program voltage applied to a word line of the selected memory cells increases by a step voltage $\Delta V$ in successive program loops.

In a plurality of program loops labeled "Coarse-Fine verify", program verification operations are performed using a coarse-fine sensing scheme. In this scheme, program and program verify operations are performed in sequence on a plurality of selected memory cells.

In a fine sensing scheme according to some embodiments, a predetermined voltage is applied to a selected word line and a precharge voltage is applied to all bit lines connected to the selected memory cells. Then, sensing is performed on the selected memory cells.

In the coarse-fine sensing scheme, different bit line precharge operations are used for a coarse sensing operation and a fine sensing operation. In the coarse sensing operation, a precharge voltage is applied to all of the selected bit lines before sensing is performed on the selected memory cells. Next, in the fine sensing operation, the bit line precharge operation is performed on bit lines connected to selected memory cells that were detected to be "off-cells" in the coarse sensing operation.

In the coarse-fine sensing scheme, current sensing is performed while selected bit lines are maintained at a predetermined level. Accordingly, the level of a common source line remains high, which can cause a sensing error. Moreover, as the number of "on-cells" having large cell current increases, the likelihood of a sensing error tends to increase.

Consequently, after every bit line of programmed memory cells is precharged, coarse sensing is performed so that on-cells and off-cells are identified in a state in which the cells contain noise that may occur due to, e.g., the resistance components of the common source line. Thereafter, based on the coarse sensing result, a bit line of only off-cells is precharged and then verification is performed again using fine sensing.

When programmed memory cells are verified using the coarse-fine sensing scheme, the number of on-cells decreases and the number of off-cells increases as most of the cells have been completely programmed. Accordingly, noise caused by the common source line is reduced, and verification is performed using only fine sensing in a "Fine verify" stage of the program operation.

Where program verification is performed using the coarse-fine sensing scheme in every program loop, sensing errors caused by noise from the common source line can be reduced, but program/verify time increases.

Figure 2:
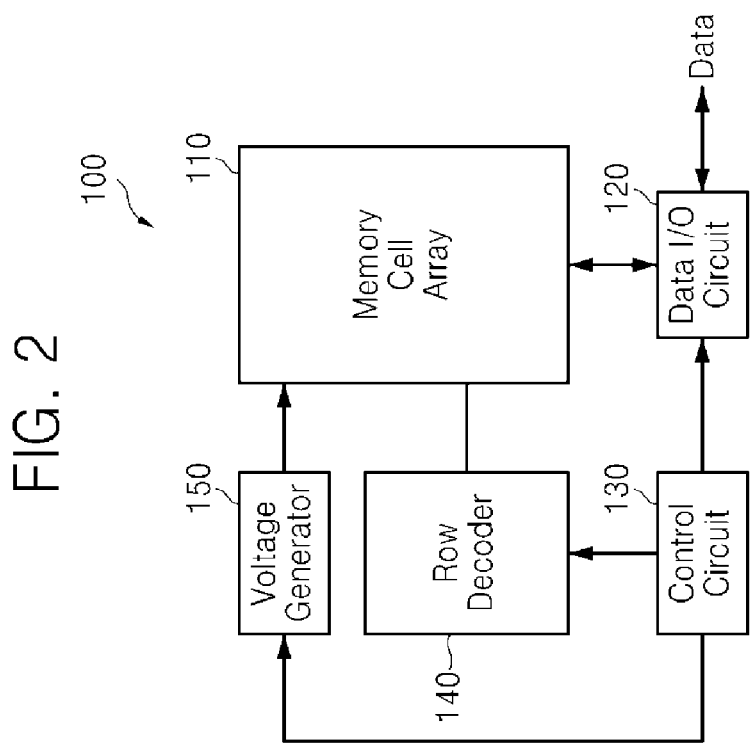
FIG. 2 is a block diagram of a flash memory device according to an embodiment of the inventive concept.

FIG. 2 is a block diagram of a flash memory device 100 according to an embodiment of the inventive concept.

Referring to FIG. 2, flash memory device 100 comprises a memory cell array 110, a data input/output (I/O) circuit 120, a control circuit 130, a row decoder 140, and a voltage generator 150. Memory cell array 110 comprises a plurality of memory cells each connected to a word line and a bit line.

Figure 3:
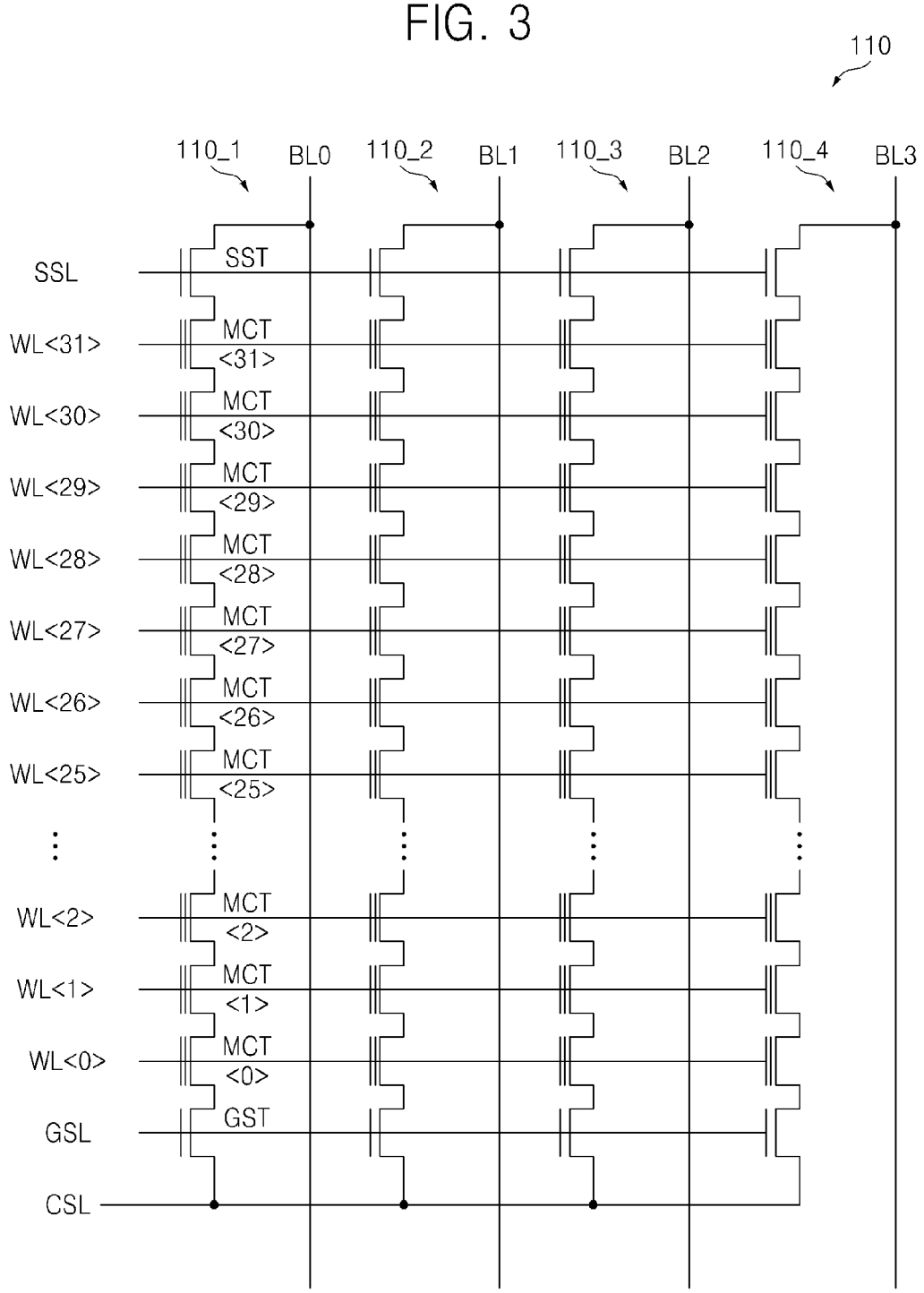
FIG. 3 is a circuit diagram of a memory cell array of FIG. 2 according to an embodiment of the inventive concept.

FIG. 3 is a circuit diagram of memory cell array 110 according to an embodiment of the inventive concept.

Referring to FIG. 3, memory cell array 110 comprises a plurality of cell strings 110_1, 110_2, 110_3, and 110_4. For simplicity, only four cell strings 110_1, 110_2, 110_3, and 110_4 are shown in FIG. 3. However, memory cell array 110 typically includes more than four cell strings.

Each of cell strings 110_1, 110_2, 110_3, and 110_4 comprises 32 memory cell transistors MCT<0> through MCT<31>, but the number of memory cell transistors in each cell string can be changed in other embodiments.

Each cell string comprises a string selection transistor SST connected to a string selection line SSL, a plurality of memory cells respectively connected to a plurality of word lines WL<0> through WL<31>, and a ground selection transistor GST connected to a ground selection line GSL. String selection transistor SST is connected to a corresponding one of a plurality of bit lines BL0 through BL3. Ground selection transistor GST is connected to a common source line CSL.

Referring again to FIG. 2, data I/O circuit 120 receives data from an external source and temporarily stores the data before it is programmed in selected memory cells through a program operation. Data I/O circuit 120 also reads data from a selected memory cells through selected bit lines and outputs the data to an external destination.

Control circuit 130 controls other parts of flash memory device 100, and it controls the performance of program operations and program verify operations.

Figure 4:
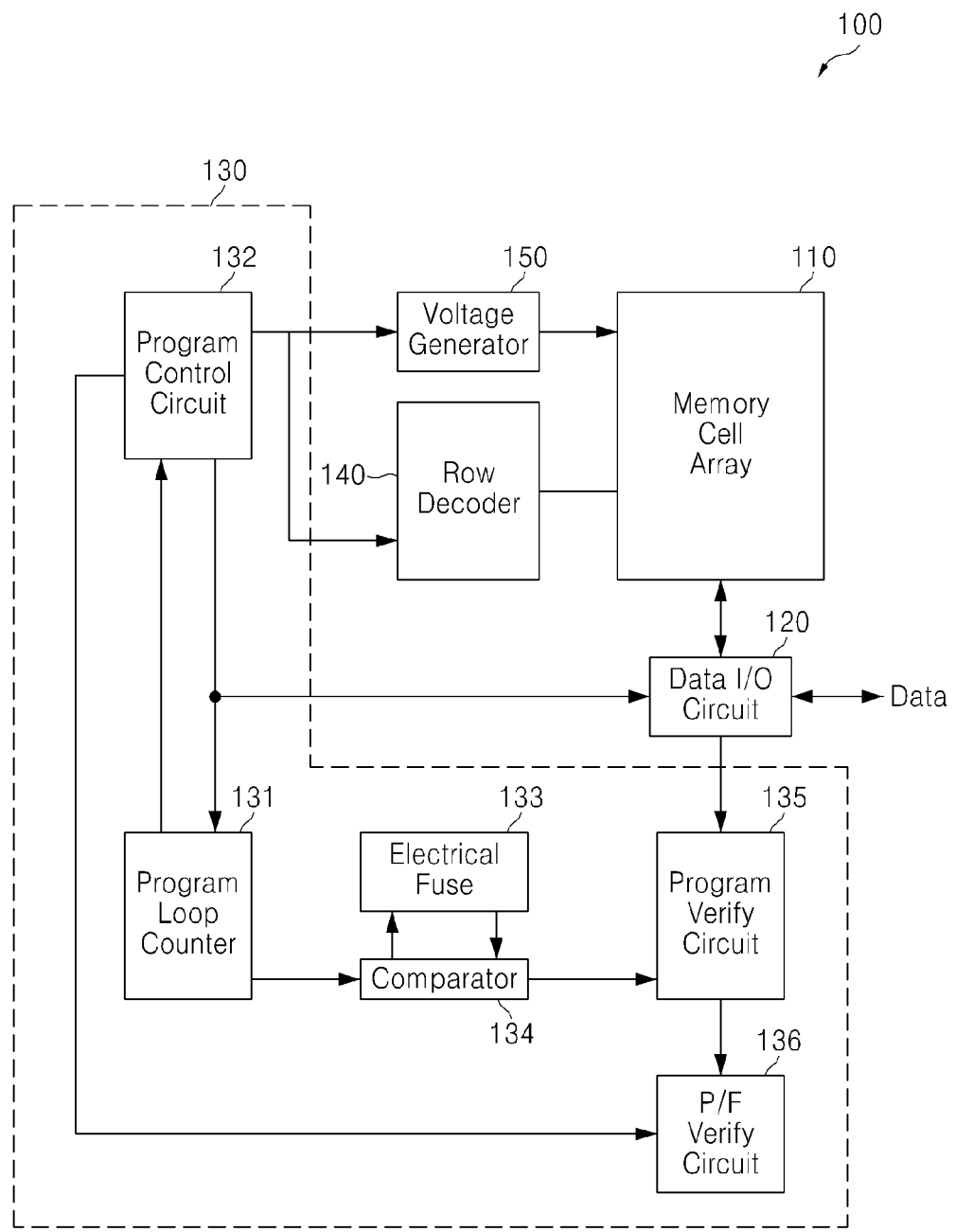
FIG. 4 is a block diagram of a flash memory device according to an embodiment of the inventive concept.

FIG. 4 is a block diagram of flash memory device 100 with a more detailed structure of control circuit 130 according to an embodiment of the inventive concept.

Referring to FIG. 4, control circuit 130 comprises a program loop counter 131, a program control circuit 132, an electrical fuse 133, a comparator 134, a program verify circuit 135, and a pass/fail (P/F) verify circuit 136.

Program loop counter 131 counts a number of program loops in which a program operation and a program verify operation are performed on memory cell array 110 and outputs a count result, i.e., a program loop count to comparator 134. Program loop counter 131 counts program loops up to a predetermined count N (N is greater than or equal to 1) to perform program verification on a programmed memory cell.

Program control circuit 132 outputs internal control signals (not shown) to control operations (e.g., program operations, erase operations, and read operations) of flash memory device 100.

Program control circuit 132 controls flash memory device 100 so that program and program verify operations are performed on memory cell array 110 using one of various methods described below. For example, program control circuit 132 typically controls internal parts of flash memory device 100 so that selected memory cells are programmed according to an ISPP scheme based on a number of program loops counted by program loop counter 131.

Electrical fuse 133 outputs to comparator 134 a predetermined selection signal (not shown) for selecting a value of M (M>1) among program loop counts up to N. The value M may indicate program loop counts corresponding to multiples of an integer (e.g., multiples of 2, 3, or 4). Although the embodiment of FIG. 4 uses electrical fuse 133 to set the value M, other embodiments can use different techniques. For instance, the values N and/or M can be set using a register.

Comparator 134 checks whether the program loop count satisfies a predetermined verification condition and outputs a check result to program verify circuit 135.

In other words, comparator 134 checks whether the program loop count received from program loop counter 131 reaches the maximum program loop count N predetermined by program loop counter 131. Where the program loop count is less than the maximum program loop count N, comparator 134 determines whether the program loop count is equal to the value M, and outputs a result of the determination to program verify circuit 135.

Program verify circuit 135 performs coarse-fine sensing or fine sensing on programmed memory cells based on the result output by comparator 134. Program verify circuit 135 may consecutively perform first verification and second verification on a programmed memory cell or perform only second verification with the first verification skipped based on the comparison result from comparator 134. Here, the first verification denotes coarse sensing and the second verification denotes fine sensing.

Accordingly, consecutively performing the first verification and the second verification means performing coarse-fine sensing. Performing only second verification with the first verification skipped means performing only fine sensing without performing coarse sensing.

Program verify circuit 135 performs verification on a programmed memory cell using coarse-fine sensing when it is determined that the program loop count satisfies the predetermined verification condition based on the comparison result of comparator 134. Otherwise, program verify circuit 135 performs verification on the programmed memory cell using fine sensing when it is determined that the program loop count does not satisfy the predetermined verification condition.

P/F verify circuit 136 is connected with program verify circuit 135 and program control circuit 132. It determines a program pass or fail status of a programmed memory cell based on a control signal received from program control circuit 132 while program verify circuit 135 performs verification on the programmed memory cell. In other words, P/F verify circuit 136 verifies whether the programmed memory cell has reached a predetermined level every time the program loop count reaches the maximum program loop count N.

Where the programmed memory cell has a predetermined threshold voltage, P/F verify circuit 136 determines that the programmed memory cell has a program pass status, no further program or program verify operations are performed. However, where the programmed memory cell has not reached the predetermined threshold voltage, P/F verify circuit 136 determines that the programmed memory cell has the program fail status and generates a count signal (not shown).

Next, program loop counter 131 increases the program loop count by 1 based on a control signal from program control circuit 132. Voltage generator 150 increases a program voltage applied to a selected word line by the step voltage $\Delta V$, and flash memory device 100 performs another program and the program verify operation on the programmed memory cell.

Row decoder 140 is connected with memory cell array 110 through word lines WL<0> through WL<31> and selects one word line from among word lines WL<0> through WL<31> based on a control signal (not shown) of control circuit 130.

Voltage generator 150 generates voltages (e.g., a program voltage, a pass voltage, and a read voltage) for operations of flash memory device 100. Voltage generator 150 generates word lines voltages VWL and bit line voltages (not shown), for the program and the program verify operations of flash memory device 100, and provides them to memory cell array 110. Word line voltages VWL include the program voltage provided to a memory cell for the program operation and a verify voltage provided to a programmed memory cell for the program verify operation.

Voltage generator 150 provides the program voltage to a selected word line and the pass voltage to unselected word lines. The program voltage is higher than the pass voltage and the pass voltage is higher than the read voltage.

Figure 5:
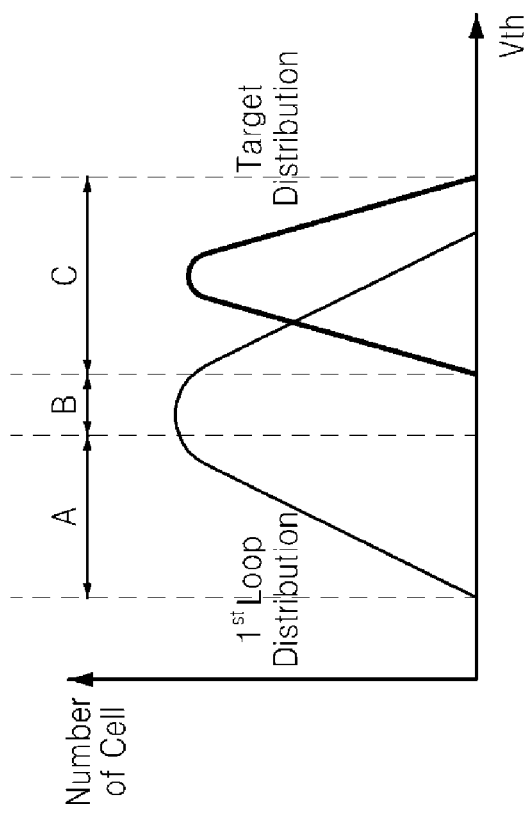
FIG. 5 is a threshold voltage diagram of programmed memory cells according to an embodiment of the inventive concept.

FIG. 5 is a threshold voltage diagram of programmed memory cells according to an embodiment of the inventive concept.

Referring to FIG. 5, where verification is performed using fine sensing with a program loop count of 1, the distribution of memory cells covers regions A, B, and C. Cells in region A are judged as on-cells and are subjected to programming at a next program loop count. However, cells in regions B and C are judged as off-cells and inhibited from being programmed at the next program loop count.

Because programming of cells in region B is inhibited even though the cells have not been programmed completely, when verification is performed on the cells in region B, which have been wrongly judged as off-cells, using coarse-fine sensing at the next program loop count, the distribution of the cells, which has covered regions A through C, exists in only region C. This procedure will be described in detail with reference to FIGS. 6 and 7.

Figure 6:
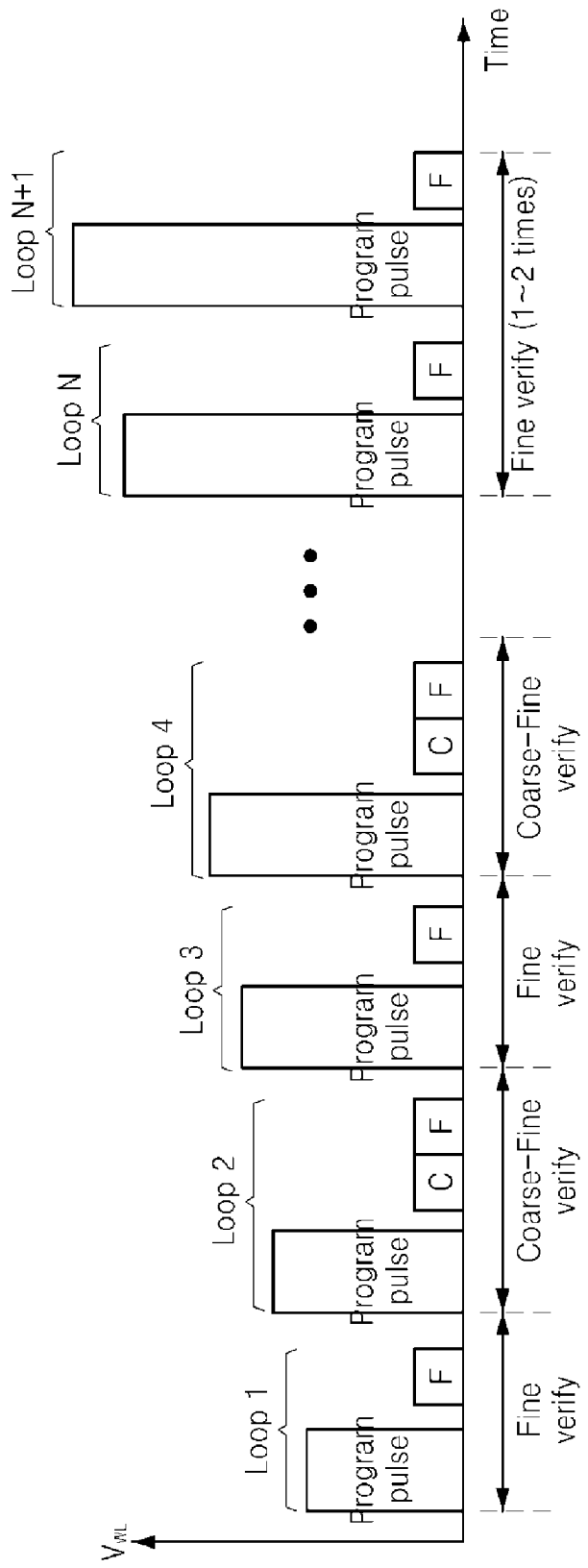
FIG. 6 is a voltage diagram illustrating a program verification method for a flash memory device according to an embodiment of the inventive concept.

FIG. 6 is a voltage diagram illustrating a program verification method for a flash memory device according to an embodiment of the inventive concept.

Referring to FIG. 6, the program and the program verification operations are performed on memory cells to be programmed. A program voltage is applied to a selected word line with a magnitude that increases by step voltage ΔV in successive program loops from a first program loop Loop1 to an L-th program loop LoopL.

As a result of verifying the programmed memory cells using fine sensing in first program loop Loop1, the memory cells in region A are judged as on-cells, as illustrated in FIG. 5, and thus programmed in second program loop Loop2. The cells in regions B and C are judged as off-cells and are inhibited from being programmed in a second program loop Loop2.

Next, where the program verify operation is performed using coarse-fine sensing after the program operation in second program loop Loop2, off-cells (i.e., the memory cells in regions B and C of FIG. 5) that have been inhibited from being programmed in second program loop Loop2, are also verified.

As a result of performing the program verify operation using the coarse-fine sensing in second program loop Loop2, the memory cells in region B are distinguished from the cells in region C. The cells in region C, which has been inhibited from being programmed in second program loop Loop2, are still inhibited from being programmed in third program loop Loop3. The cells in region B are subjected to bit line forcing programming in third program loop Loop3. Next, the cells in region B of first program loop Loop1 move to region C in third program loop Loop3.

At this time, the bit line forcing programming is an operation of applying a predetermined bit line forcing voltage to a bit line of a memory cell to be programmed. The bit line forcing voltage is higher than a bit line voltage applied in the normal program operation. For instance, where 0 V is applied to a bit line of a memory cell to be programmed, and a supply voltage VDD is applied to a bit line of a memory cell not to be programmed in a normal program operation, a voltage higher than 0 V (e.g., a voltage higher than 0 V and lower than 1 V) is applied to the bit line of the memory cell to be programmed in the bit line forcing programming with the other conditions kept the same as the normal program operation.

With the repetition of the above-described procedure, most cells are completely programmed, and therefore, the number of on-cells decreases and the number of off-cells increases. As a result, noise caused by common source line CSL is eliminated or reduced. Accordingly, verification can be performed using only fine sensing at program loops in the later stage.

In other words, verification is performed using coarse-fine sensing where the program loop count below the value N is equal to the value M (e.g., any one of the multiples of 2), and the verification is performed using fine sensing in the remaining program loops. Where the program loop count is N or greater, the verification is performed using only fine sensing. Accordingly, the program verification operation using the coarse-fine sensing is selectively performed.

In addition, a verify voltage applied to programmed memory cells in the verification using the coarse-fine sensing may be the same throughout all program loops. A verify voltage used to perform the verification using the fine sensing may be greater than or equal to the verify voltage used to perform the verification using the coarse-fine sensing.

FIG. 7 is a voltage diagram illustrating a program verification method of a flash memory device according to an embodiment of the inventive concept. The method illustrated in FIG. 7 is substantially the same as the method illustrated in FIG. 6, except that the value M represents multiples of 3 and verification is performed using coarse-fine sensing every time the program loop count is the value M and below the value N.

In the method of FIG. 7, an increment of the program voltage applied to a selected word line is less than that in the method illustrated in FIG. 6 and a bit line forcing voltage used in the method of FIG. 7 is higher than that in the method of FIG. 6.

FIG. 8 is a table illustrating changing states of selected memory cells in the program verification method of FIG. 6. Referring to FIGS. 5, 6, and 8, as a result of performing verification on programmed memory cells using fine sensing after performing a program operation in first program loop Loop1, memory cells in regions B and C are judged as off-cells and inhibited from being programmed in second program loop Loop2.

Next, where the programmed memory cells are verified using coarse-fine sensing after being programmed in second program loop Loop2, cells in regions B and C, which have been inhibited from being programmed in second program loop Loop2, are also verified. Memory cells in region B are distinguished through the verification are subjected to bit line forcing programming in third program loop Loop3. As a result, the memory cells in region B in first program loop Loop1 belong to region C in third program loop Loop3.

Where the above-described procedure is repeated, all memory cells arrive in region C at later program loops. As a result, noise caused by a common source line is eliminated or reduced, and therefore, the entire program operation can be finished with verification using only fine sensing.

FIG. 9 is a flowchart illustrating the program verification method of FIG. 6 or 7 according to an embodiment of the inventive concept. In the description that follows, example method steps are indicated by parentheses to distinguish them from example apparatus features.

Referring to FIG. 9, before programming and verification is performed on flash memory device 100, a program loop count is initialized (S10).

Next, programming is performed on selected memory cells of memory cell array 110 at the current program loop count (S20). The current program loop count is compared with predetermined verification conditions, i.e., predetermined values N and M (where N is 1 or more and M is greater than 1) (S30 and S40). At this time, the value M is an integer multiple of the initial program loop count. For instance, the value M may be a multiple of 2 or 3.

Where the current program loop count is less than the value N and equal to the value M (S30=No and S40=Yes), verification is performed using coarse-fine sensing (S50). Where the current program loop count is greater than or equal to the value N or is not equal to the value M (S30=Yes or S40=No), verification is performed using only fine sensing (S60).

Next, a program pass or fail of a memory cell programmed in operation S20 is judged (S70). The program fail of the programmed memory cell is judged, the program loop count is increased (S80). Operations S20 through S80 are repeated until the programmed memory cell is determined to be in the program pass state.

Figure 10:
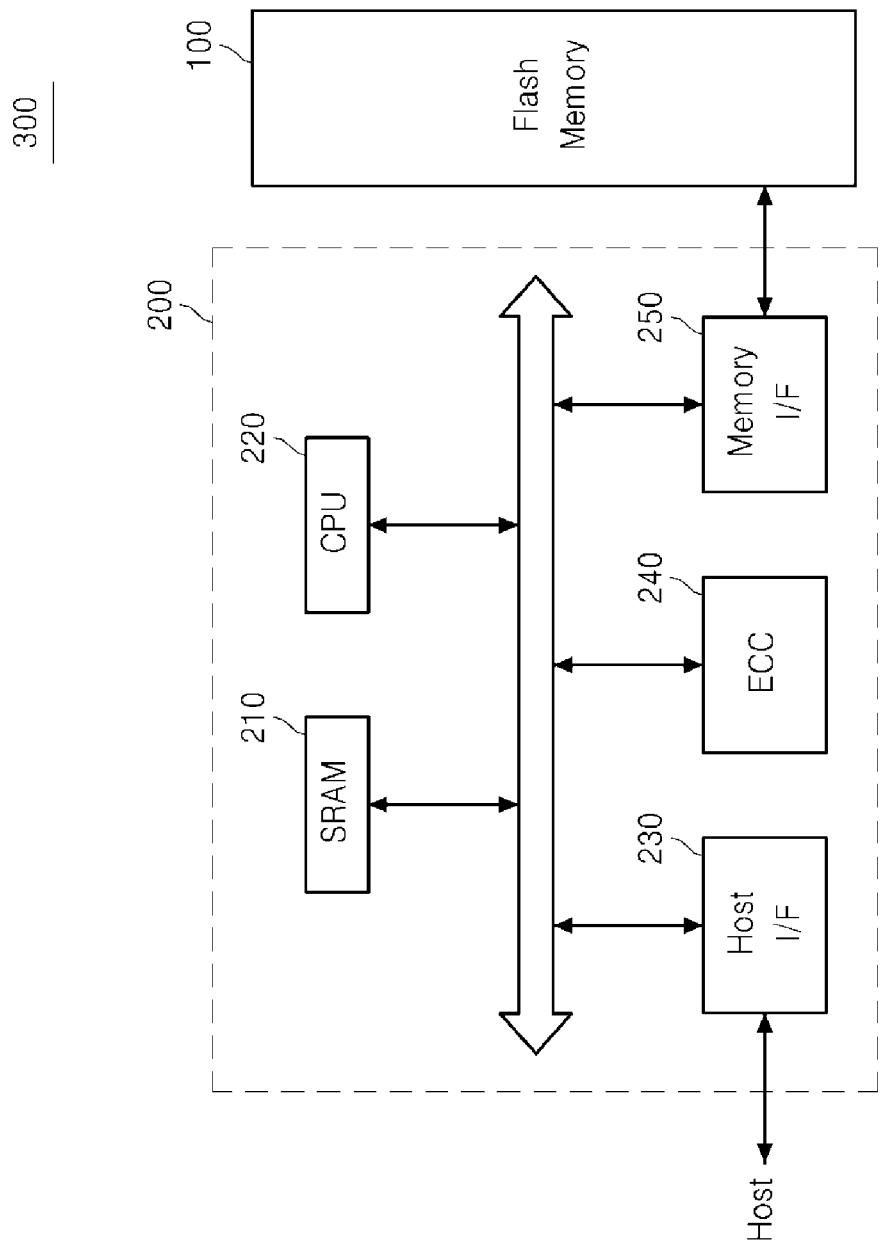
FIG. 10 is a block diagram of a memory card incorporating a flash memory device according to an embodiment of the inventive concept.

FIG. 10 is a schematic block diagram of a memory card 300 incorporating flash memory device 100 according to an embodiment of the inventive concept.

Referring to FIG. 10, memory card 300 comprises flash memory device 100, and a memory controller 200 that controls data exchange between a host and flash memory device 100. Flash memory device 100 compares reference data, which has been stored in a program operation, with comparison data, which is read in a read operation, and estimates a read voltage based on a difference between the reference data and the comparison data.

Memory controller 200 comprises a static random access memory (SRAM) 210, a central processing unit (CPU) 220, a host interface (I/F) 230, an error correction code (ECC) block 240, and a memory I/F 250. SRAM 210 is used as a working memory of CPU 220. Host I/F 230 is equipped with a data exchange protocol of the host connected to memory card 300. ECC block 240 detects and corrects errors included in data read from flash memory device 100. Memory I/F 250 interfaces with flash memory device 100. CPU 220 controls overall operations for data communication of memory controller 200. Although not shown in FIG. 10, it will be obvious to those of ordinary skill in the art that memory card 300 may also include a read-only memory (ROM) storing code data for interface with the host.

Figure 11:
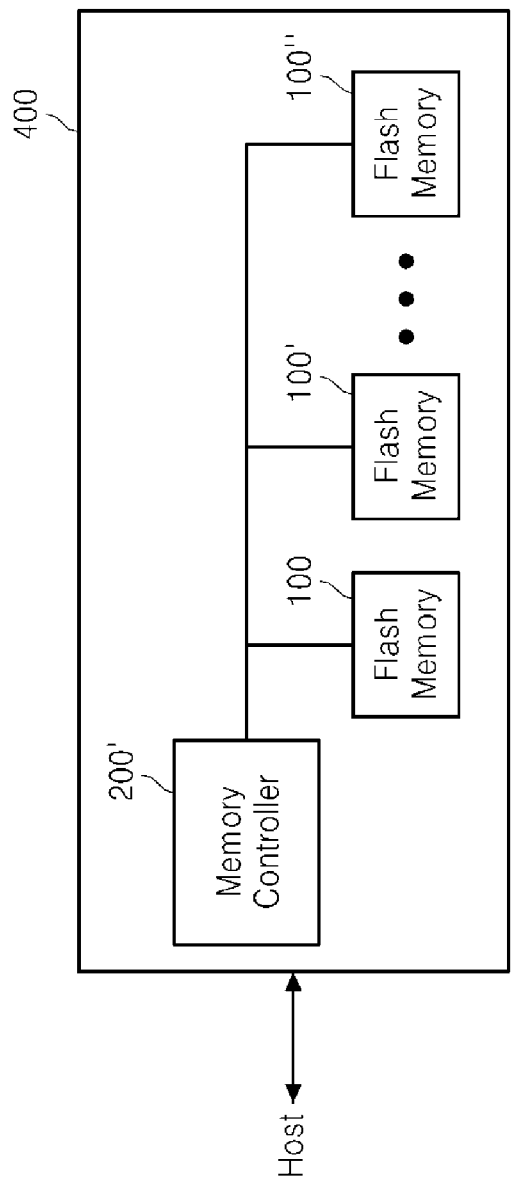
FIG. 11 is a block diagram of a memory card incorporating a flash memory device according to an embodiment of the inventive concept.

FIG. 11 is a block diagram of a memory card 400 incorporating a plurality of flash memory devices 100, 100', ..., 100".

Referring to FIG. 11, memory card 400 comprises flash memory devices 100, 100', ..., 100" and a memory controller 200'. Flash memory devices 100, 100', ..., 100" are connected in parallel, and they are controlled by memory controller 200'.

The above embodiments can be used in various applications, such as cellular phones, personal digital assistants (PDAs), digital cameras, portable game consoles, MP3 players, high definition televisions (HDTVs), a DVD player, a router, or a global positioning system (GPS). These embodiments can also be incorporated in computing systems such as mobile computing equipment or desktop computers.

Figure 12:
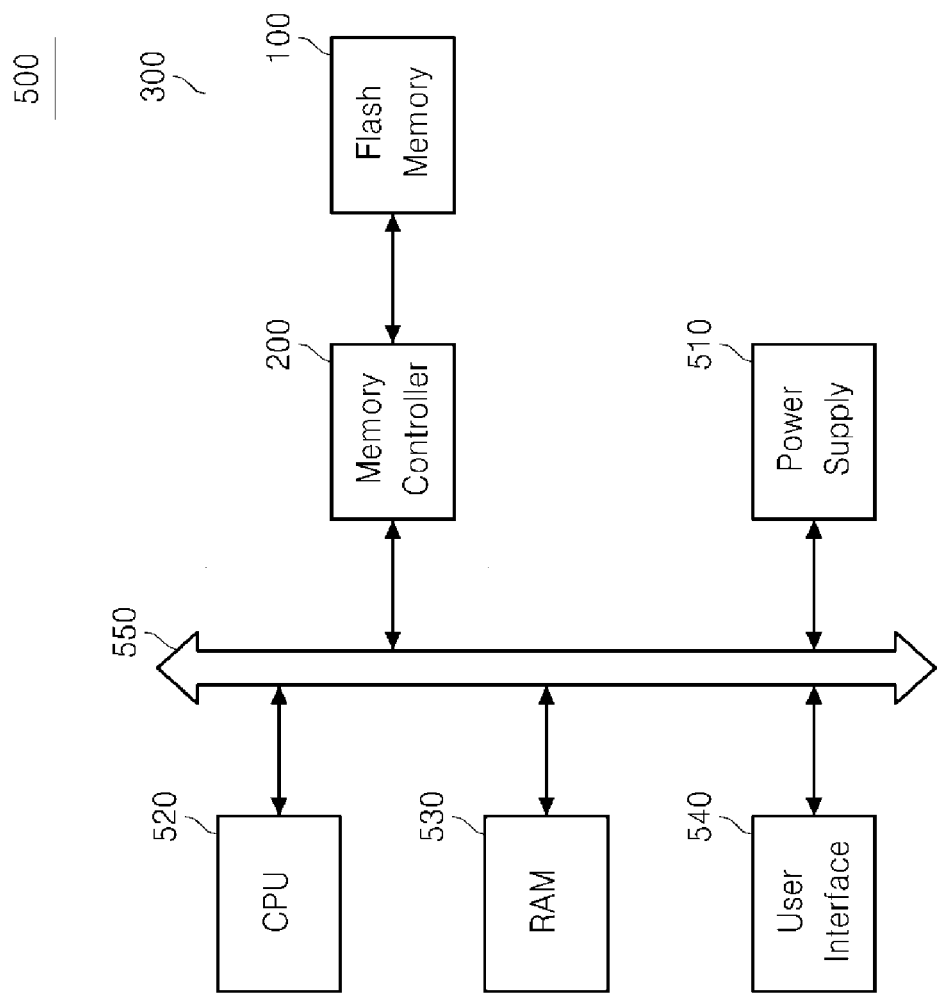
FIG. 12 is a block diagram of a system incorporating a flash memory device according to an embodiment of the inventive concept.

FIG. 12 is a block diagram of a system 500 incorporating a flash memory device according to an embodiment of the inventive concept.

Referring to FIG. 12, system 500 comprises memory card 300, which incorporates flash memory device 100 and memory controller 200. System 500 further comprises a power supply 510, a CPU 520, a RAM 530, and a user interface 540, which are electrically connected to one another through a system bus 550. CPU 520 controls the overall operation of system 500. RAM 530 stores information necessary for operation of system 500. User interface 540 provides an interface between system 500 and a user. Flash memory device 100 has substantially the same structure as flash memory device 100 of FIG. 2.

N-bit data (N is greater than or equal to 1) is provided through user interface 540 or CPU 520 and stored in flash memory device 100 through memory controller 200. Flash memory device 100 estimates a read voltage by comparing reference data (e.g., the number of 0s included in program data) that has been stored in a program operation, with comparison data (e.g., the number of 0s included in read data) read in a read operation. Flash memory 100 then reads data using the estimated read voltage. Memory controller 200 controls the program and the read operations of flash memory device 100.

Although memory controller 200 and flash memory device 100 are formed in a single memory card 300 in the embodiment of FIG. 12, they can be formed separately in other embodiments. Although not shown, system 500 can also include other features such as an application chipset, a camera image processor (CIS), or a mobile dynamic RAM (DRAM). In some embodiments, memory controller 200 and flash memory device 100 may form a solid-state drive/disk (SSD) using non-volatile memory to store data.

The inventive concept can also be embodied in computer-readable codes stored in a computer-readable medium. The computer-readable recording medium can be any data storage device capable of storing and outputting data to a computer. Examples of computer-readable recording media include read-only memory (ROM), random-access memory (RAM), CD-ROMs, magnetic tapes, floppy disks, and optical data storage devices. The computer-readable medium can also be distributed over network coupled computer systems so that the computer-readable code is stored and executed in a distributed fashion. The inventive concept can also be embodied in functional programs, codes, or code segments.

As indicated by the foregoing, in some embodiments of the inventive concept, instead of performing coarse-fine verification in every program loop, coarse verification is skipped in certain program loops according to a predetermined rule, so that a program and verify time is reduced and program performance is increased.

While the inventive concept has been particularly shown and described with reference to certain embodiments, those skilled in the art will recognize that various changes in forms and details can be made to these embodiments without departing from the scope of the inventive concept as defined by the following claims.

What is claimed is:

1. A method of performing a program verification operation of a flash memory device employing an incremental step pulse programming (ISPP) scheme, the method comprising:
   (a) setting a program loop count;
   (b) programming a selected memory cell according to the program loop count;
   (c) determining whether the program loop count satisfies a predetermined verification condition;
   (d) consecutively performing first verification and second verification on the selected memory cell if the program loop count satisfies the predetermined verification condition;
   (e) performing the second verification on the selected memory cell and skipping the first verification if the program loop count does not satisfy the predetermined verification condition;
   (f) determining a program pass or fail status of the selected memory cell; and
   (g) increasing the program loop count according to the program pass or fail status and repeating operations (b) through (e),
   wherein (d) is performed at least one time after (e).

2. The method of claim 1, wherein the first verification is verification using coarse sensing and the second verification is verification using fine sensing.

3. The method of claim 2, wherein (c) comprises comparing the program loop count with a value N greater than or equal to 1 and a value M greater than 2;
   where the program loop count is less than the value N and is equal to the value M, performing (d); and
   where the program loop count is greater than or equal to the value N or the program loop count is not equal to the value M, performing (e).

4. The method of claim 3, wherein the value M is any value of the program loop count corresponding to a multiple of a designated integer.

5. The method of claim 1, wherein where (f) determines the program fail status after operation (d), bit line forcing programming is performed on the selected memory cell before (e).

6. The method of claim 5, wherein a bit line forcing voltage applied to a bit line of the selected memory cell during the bit line forcing programming is higher than a bit line voltage applied to a bit line of a cell to be programmed in a normal program operation.

7. The method of claim 6, wherein the bit line forcing voltage increases in proportion to the program loop count at which the bit line forcing programming is performed.

8. A computer-readable medium storing code for executing the program verification method of claim 1.

9. A flash memory device that performs a program operation using an incremental step pulse programming (ISPP) scheme, comprising:
   a program loop counter configured to set a program loop count;
   a program control circuit configured to program a selected memory cell according to the program loop count;
   a comparator configured to determine whether the program loop count satisfies a predetermined verification condition;
   a program verify circuit configured to consecutively perform first verification and second verification on the selected memory cell if the program loop count satisfies the predetermined verification condition and to perform only the second verification on the selected memory cell and skip the first verification if the program loop count does not satisfy the predetermined verification condition; and
   a pass/fail verify circuit configured to determine a program pass or fail status of the selected memory cell,
   wherein the program loop counter increases the program loop count according to the program pass or fail status, and the first verification and the second verification are consecutively performed at least one time after the second verification is performed and the first verification is skipped.

10. The flash memory device of claim 9, wherein the first verification is verification using coarse sensing and the second verification is verification using fine sensing.

11. The flash memory device of claim 10, wherein the comparator compares the program loop count with a value N greater than or equal to one and a value M greater than one; and the program verify circuit performs the first verification and the second verification where the program loop count is less than the value N and equal to the value M, and performs only the second verification where the program loop count is greater than or equal to the value N or the program loop count is not equal to the value M.

12. The flash memory device of claim 11, wherein the value M is any value of the program loop count corresponding to a multiple of a designated integer.

13. The flash memory device of claim 9, wherein where the pass/fail verify circuit determines that the selected memory cell has the program fail status after the first verification and the second verification are consecutively performed, the program control circuit performs bit line forcing programming on the selected memory cell before performing the second verification and skipping the first verification.

14. The flash memory device of claim 13, wherein a bit line forcing voltage applied to a bit line of the selected memory cell during the bit line forcing programming is higher than a bit line voltage applied to a bit line of a cell to be programmed in a normal program operation.

15. The flash memory device of claim 14, wherein the bit line forcing voltage increases in proportion to the program loop count at which the bit line forcing programming is performed.

16. An electronic system, comprising:
   a host device connected to a memory controller and a nonvolatile memory device, wherein the memory controller controls the nonvolatile memory device to perform a program operation in response to a request from the host, and the nonvolatile memory device performs the program operation using an incremental pulse programming (ISPP) scheme in which a plurality of program loops alternate between a coarse-fine verify operation, and a fine verify operation according to a value of a program loop counter; wherein the fine verify operation is performed upon determining that a program loop count is greater than or equal to a predetermined value N or not a multiple of a predetermined integer, and the coarse-fine verify operation is performed upon determining that the program loop count is less than the predetermined value N and a multiple of the predetermined integer.

17. The electronic system of claim 16, wherein the predetermined integer is 2.

18. The electronic system of claim 16, wherein the nonvolatile memory device is a NAND flash memory device.

* * * * *